United States Patent [19]

Mirabel

[11] Patent Number: 5,592,417

[45] Date of Patent: Jan. 7, 1997

[54] NON-VOLATILE PROGRAMMABLE BISTABLE MULTIVIBRATOR, PROGRAMMABLE BY THE SOURCE, FOR MEMORY REDUNDANCY CIRCUIT

[75] Inventor: Jean-Michel Mirabel, Gardanne, France

[73] Assignee: SGS-Thomson Microelectronics S.A., Saint Genis Pouilly, France

[21] Appl. No.: 380,738

[22] Filed: Jan. 30, 1995

[30] Foreign Application Priority Data

Jan. 31, 1994 [FR] France ................................. 94 01035

[51] Int. Cl.$^6$ ................................................. G11C 16/06
[52] U.S. Cl. ................................. 365/185.07; 365/185.09
[58] Field of Search .......................... 365/185.07, 185.09, 365/200, 154, 49

[56] References Cited

U.S. PATENT DOCUMENTS

| | | | |
|---|---|---|---|
| 5,136,544 | 8/1992 | Rozman | 365/185.07 |
| 5,267,213 | 11/1993 | Sung | 365/185.07 |
| 5,440,508 | 8/1995 | Pathak | 365/185.07 |

FOREIGN PATENT DOCUMENTS

| | | | |
|---|---|---|---|
| 0525680 | 2/1993 | European Pat. Off. | G11C 16/04 |
| WO-A-9318518 | 9/1993 | WIPO | G11C 11/34 |

OTHER PUBLICATIONS

IEEE Journal of Solid–State Circuits, vol. 22, No. 5, Oct. 1987 New York US, pp. 684–692, Ciaoca et al. "A Million-–Cycle CMOS 256K EEPROM".

IEEE Journal of Solid–State Circuits, vol. 17, No. 5, Oct. 1982, New York US, pp. 847–851, Donaldson et al. "SNOS 1K×8 Static Nonvolatile RAM".

*Primary Examiner*—David C. Nelms
*Assistant Examiner*—Son Mai
*Attorney, Agent, or Firm*—David M. Driscoll; James H. Morris

[57] ABSTRACT

An electrically programmable, non-volatile memory that can be used for the storage of the defective addresses in a redundancy circuit of a main memory, using bistable type non-volatile cells. Each cell includes floating-gate transistors, one of which is programmed to make the cell bistable. The floating-gate transistor is programmed by the application of a high voltage, to the gate, an intermediate voltage to the source and a zero voltage or a high impedance state to the drain.

30 Claims, 3 Drawing Sheets

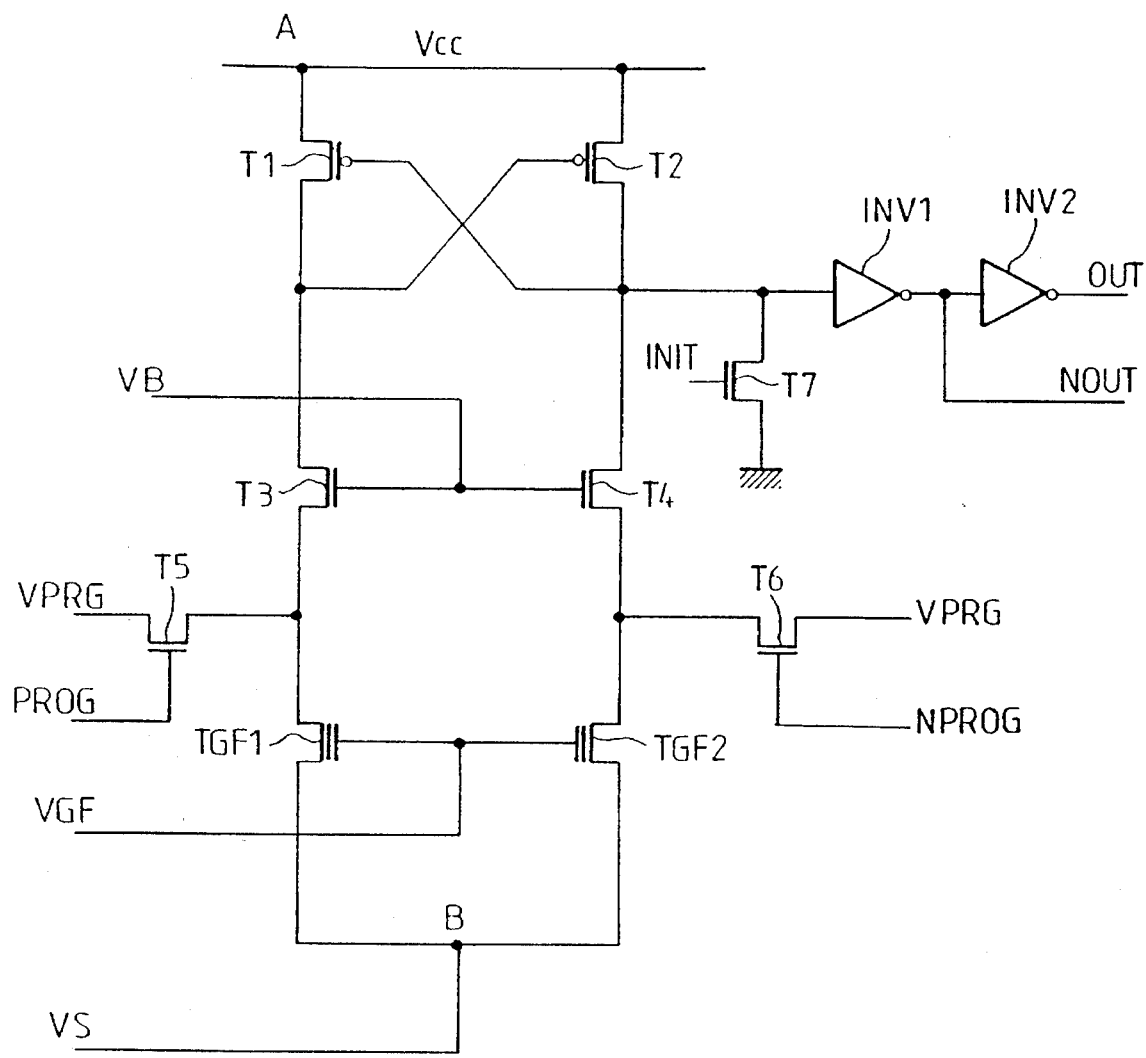
FIG_1
PRIOR ART

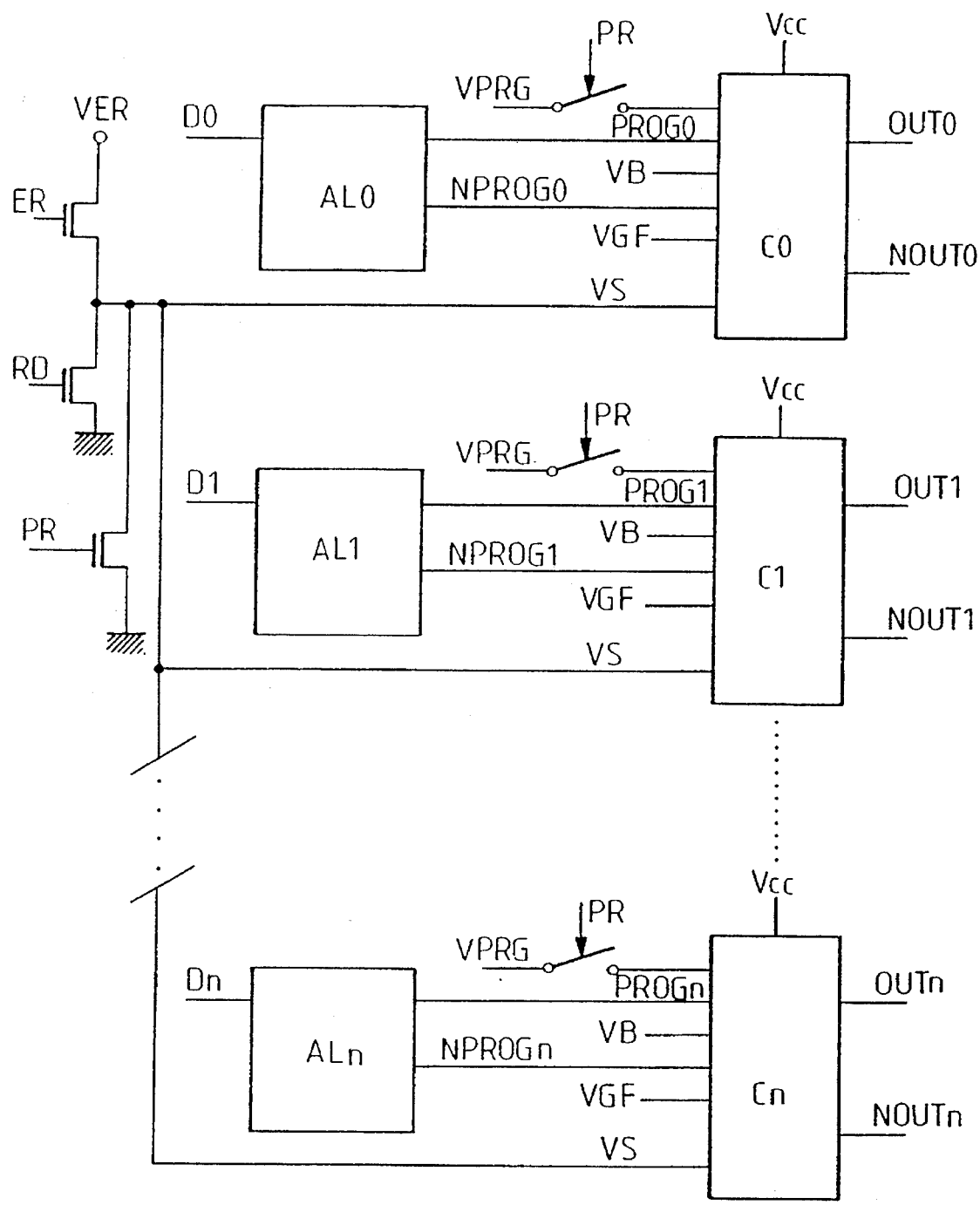
FIG_2

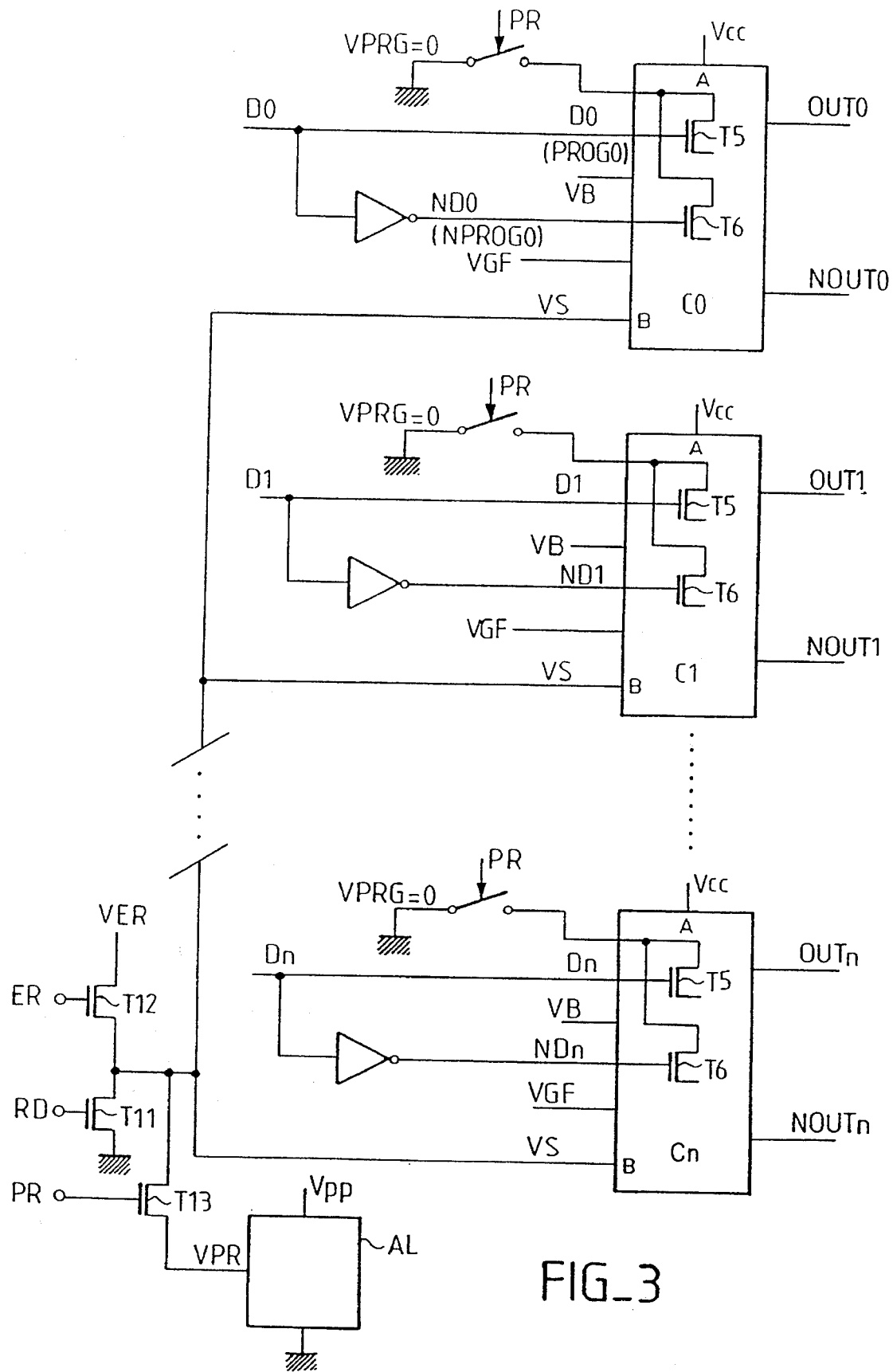
FIG_3

NON-VOLATILE PROGRAMMABLE BISTABLE MULTIVIBRATOR, PROGRAMMABLE BY THE SOURCE, FOR MEMORY REDUNDANCY CIRCUIT

BACKGROUND OF THE INVENTION

1. Field of the Invention

The invention relates to integrated circuits, and more particularly to a non-volatile electrically programmable bistable multivibrator which can be used, for example, in a redundancy circuit of a memory in integrated circuit form.

2. Discussion of the Related Art

To provide for a clear understanding of the invention in the context in which it has been conceived of, a brief reminder shall first of all be given of the principles of redundancy circuits currently used in large-capacity memories.

The redundancy circuits of a memory are implemented when defects appear in the rows (word lines used to address the memory) or in the columns (bit lines conveying the data elements to be read or written in the memory).

For example, if a column is defective, it is replaced by a redundancy column as follows: the address of the defective column is stored in a defective address memory; this defective address memory is a memory of the type that is addressable by its contents (hereinafter called CAM or contents addressable memory); whenever an address is applied to the main memory, this address is also applied to the CAM. If the address applied is identical to the address stored, a redundancy circuit is put into operation and acts to disconnect the defective column and connect a redundant column in its place in a way that is invisible to the user.

In practice, according to the organization of the main memory, if a column is defective, it is rather a group of columns containing this defective column that will be replaced by a group of redundancy columns. In general, if a group of columns is defined by an address bit of the large-capacity memory, it is this group of columns that will be replaced as a whole. Hereinafter, for simplicity's sake, reference shall be made, in the description, to the replacing of only one column rather than to the replacing of a group of columns.

For a main memory of several megabits, the possibility of repairing several defects is foreseen. There are therefore as many redundancy columns as there are defective columns or rows which it should be possible to repair. With each redundancy column, there is associated a respective CAM containing the address of a defective column. If N defects are to be repaired, N redundancy columns and N CAMs are needed. Typically, N=36 for a four-megabit or sixteen-megabit memory.

If a column of the main memory is designated by an M-bit address (for example M=5), then each CAM contains at least M+1 bits: M bits to define the address of a defective column and one validation bit to indicate that the redundancy circuit corresponding to this CAM should actually be activated when the defective address is applied to the CAM.

To make CAMs, the first devices used were groups of physical fuses that were fused electrically or fused by laser beam, each fuse representing an address bit or a validation bit. These fuses had drawbacks (relating to reliability, bulkiness, consumption, and difficulty of programming) and were soon replaced by non-erasable non-volatile memory cells. The latter too had drawbacks (they consumed substantial current) and there was a gradual trend towards the use of programmable bistable multivibrators comprising two floating-gate transistors for each address bit or validation bit.

FIG. 1 shows a prior art non-volatile programmable bistable multivibrator constituting a storage cell of a defective address bit (or a validation bit), and therefore constituting one of the M+1 cells of a defective address CAM.

The output OUT of this cell is at a logic level 0 or 1 depending on the state in which the bistable multivibrator is programmed. This output therefore defines a value of an address bit (or the value of the validation bit).

If the cell corresponds to one of the M defective address bits, the output of each cell of these M address bits is applied to an input of an exclusive-OR gate (not shown). The exclusive-OR gate receives, at another input, a corresponding address bit received by the main memory. The outputs of the exclusive-OR gates corresponding to the different address bits of one and the same defective address memory are applied to an input of a NOR gate (not shown). The output of this NOR gate gives a logic 1 level only when there is coincidence between all the address bits applied and all the corresponding bits of the defective address memory. The output of the NOR gate is validated by the output of the memory cell corresponding to the validation bit, for example by means of an AND gate (not shown). The output of the AND gate is the output of the CAM and is used to put a redundancy path into operation whenever the address applied to the main memory corresponds to the defective address recorded.

In general, there are N memories with defective addresses (for example N=36). During the testing of the main memory, the detection of a defective column activates the storage of the address of this column in one of the CAMs. The different CAMs are thus successively programmed as and when the defects are detected. During the normal operation of the main memory, the addresses of this memory are applied simultaneously to all the CAMs. If there is correspondence between the applied address and the address stored in one of them, the redundancy path corresponding to this address is activated.

To enable the programming of a defective address in a CAM, it is therefore provided that a respective address bit of the main memory will be applied to each cell of the CAM. The programming is done upon a command of the testing apparatus in the event of the detection of a defect at the address being tested.

The individual memory cell shown in FIG. 1 has two arms with a floating-gate transistor, TGF1 or TGF2 in each arm. The arms are arranged so as to form a bistable multivibrator as soon as one of these two transistors is programmed. The state of the bistable multivibrator, represented by the output OUT and corresponding to an address bit or a validation bit, is then a function of that one of the two transistors which is programmed. At the outset, the two transistors are in a non-programmed or blank state. During the testing of the memory, one of the two transistors is programmed to obtain either a 0 or a 1 at the output OUT of the cell, thus defining a definitive stable state 0 or 1 of the cell.

More specifically, the cell of FIG. 1 has two identical arms in parallel between a supply terminal A (potential Vcc of the order of 3 volts) and a terminal B. The terminal B is at a zero potential VS in reading or programming mode and may also be taken to a high potential VS (12 volts) in erasure mode if an erasure mode is planned (e.g., in flash EPROMs). In series in each arm, there is a P channel transistor (T1 or T2), an N channel transistor (T3 or T4), and a floating-gate transistor (TGF1 or TGF2). The gate of the P channel transistor (T1 or T2) of one of the arms is connected to the drain of the P channel transistor (T2 or T1) of the other arm. The gates of the N channel transistors (T3 or T4) are connected together to a common potential VB whose value depends on the mode of operation (about 1.8 volts in reading mode to have one volt on the drain of the cells; 0 volts in programming or erasure mode). The transistors T3 and T4 are insulation transistors to prevent the transmission, to the transistors T1 and T2, of the relatively high voltages applied to the floating-gate transistors in programming or erasure mode. The gates of the floating-gate transistors TGF1, TGF2 are connected to a common potential VGF depending on the operation (about 3 volts in read mode, about 12 volts in programming mode). The source of these transistors is connected to the node B (potential VS). The drain potentials of the floating-gate transistors are controlled by transistors T5 and T6 respectively, enabling either the connection of the drain to a programming potential VPRG (transistor T5 or T6 conductive) or the leaving of the drain in high impedance (transistor T5 or T6 off). In programming mode, the gate of the transistor T5 is controlled by a programming signal PROG and the gate of T6 by a complementary signal NPROG. As a result, a choice is made, depending on the state of the signal PROG, of that transistor of the two floating transistors which must be programmed and that transistor which must remain blank. In reading mode, the drain of the transistors T5 and T6 remains in a state of high impedance, the voltage VPRG being not applied to these drains.

The cell is called a bistable cell because it has one stable state among two possible states, the stable state that it takes depending on that one of the two transistors that has been programmed. The state of the cell is read at the drain of one of the P channel transistors (T2 for example). This drain is connected to the input of a first inverter INV1 followed by a second inverter INV2. The output of INV2 is the output OUT of the cell. The output of INV1 is used as a complementary output NOUT if it is needed.

Finally, a supplementary transistor T7 may make it possible, solely in test mode, in order to avoid the floating nodes when T3 and T4 are off, to place the input of the inverter INV1 temporarily at the ground (for an initialization of the state of the cell at each power-on-reset operation). The gate of this transistor is activated by an initializing rectangular-wave signal INIT produced by a standard power-on-reset circuit (not shown).

To program the bistable multivibrator in one state or another, a high programming voltage (VGF=about 12 volts) is applied to the control gates of the floating gate transistors, and a mean voltage (VPRG=5 to 7 volts) is applied to the drain of that one of the transistors TGF1 or TGF2 which is to be programmed. The signal PROG/NPROG defines the state 0 or 1 to be programmed. The programming is done by hot electrons, namely with a flow of current in the transistor that is programmed. The transistors T3 and T4 are off (VB=0) during the programming so that the voltage VPRG is not applied to the transistors T1 and T2 which are low-voltage transistors. The source potential VS is set at zero.

The general structure of a group of bistable cells constituting an addressable memory is shown in FIG. 2 in the case where it is furthermore sought to be able to totally erase the cells by the application of a high potential to the sources of the transistors (the case where the floating-gate transistors are flash EPROM type transistors).

The bistable cells are designated by C0 to Cn. Each one receives the voltage VPRG, the voltage VGF, the voltage Vcc, the voltage VB, the voltage VS (all these voltages are common to all the cells) and the programming data specific to each cell depending on the state in which it is to be programmed: PROG0, NPROG0 for the cell C0, PROG1, NPROG1 for the cell C1, etc.

In reading mode, the cells give the complementary outputs OUT0, NOUT0 for the cell C0, and the similar signals for the other cells: OUT1, NOUT1, etc.

In reading or programming mode, VS is set at zero by a control signal RD (reading) or PR (programming). In erasure mode, VS is set at high voltage VER (about 12 volts) by a control signal ER. In programming mode (PR) the voltage VPRG is effectively applied to the transistors T5 and T6 of the cells.

In programming mode, the programming data signals (PROG0, NPROG0 for example) must be given at a potential level that is sufficient to control the transistors T5 and T6 (FIG. 1) and transmit the voltage VPRG which is high (5 to 7 volts). Now the programming data signals are simply address bits D0 to Dn coming from the address decoder of the main memory. They therefore come from low-voltage logic circuits (generally Vcc=3 volts for this type of circuit). It is therefore necessary to place a voltage pull-up circuit between each data signal (D0 to Dn) at low voltage and the inputs PROG0, NPROG0 . . . PROGn, NPROGn at higher voltage. These voltage pull-up circuits, designated AL0 to ALn in FIG. 2, are bulky (comprising about ten transistors each for example).

SUMMARY OF THE INVENTION

One aim of the invention is to reduce the total amount of space taken up by the memory formed by a group of non-volatile programmable bistable cells.

To improve the memories of this type, one illustrative embodiment of the invention programs the floating-gate transistors by the source, specifically by applying a high programming voltage to the source and not to the drain, and by placing the drain at ground, or in a state of high impedance depending on whether or not the transistor has to be programmed.

In another illustrative embodiment of the invention, a memory formed by bistable cells comprising two floating-gate transistors each, wherein the memory comprises means for the application, in programming mode, of a first fixed programming voltage to the sources of the floating-gate transistors of the different cells, a second fixed programming voltage to the control gates and a zero voltage or a high impedance state to the drains depending on the state of programming desired for the cell. The zero voltage reference is the voltage applied to the sources in reading mode.

In a further illustrative embodiment of the invention, the memory is a flash EPROM type transistor memory, programmable by hot electrons and erasable by the application of a sufficient field between gate and source.

BRIEF DESCRIPTION OF THE DRAWINGS

Other features and advantages of the invention shall appear from the following detailed description, made with reference to the appended drawings, of which:

FIG. 1, already described shows a prior art storage cell;

FIG. 2 shows an organization of memory with several cells of the prior art; and

FIG. 3 shows an organization of memory according to the invention.

DETAILED DESCRIPTION

FIG. 3 shows the general organization of a memory according to the invention which, it shall be assumed, is a defective address memory that forms part of the redundancy circuits of a main memory and is designed to store addresses of defective elements of the main memory.

The memory cells are constituted as in FIG. 1 and may therefore receive the following voltages:

Vcc (about 3 volts) at the node A;

VPRG equal according to the invention to 0 volts at the drain of the transistors T5 and T6 in programming mode only;

VGF at the gates of the floating-gate transistors, equal to about 12 volts in programming mode, or 3 volts in reading mode;

VS at the node B, equal to about 5 to 7 volts in programming mode, 0 volts in reading mode and about 12 volts in erasure mode;

VB, biasing potential of the gates of the transistors T3 and T4, whose value is sufficient (about 1.8 volts) to make these transistors conductive in reading mode and to turn them off (VB=0) in programming mode; and a programming data element, in the form of a logic signal and its complement, D0 and ND0 for the cell 0 for example, D1, ND1 to Dn, NDn for the others; these logic signals, which have a low voltage level, come from the address decoder of the main memory and are directly applied to the gates of the transistors T5 and T6 without the use of voltage pull-up circuits.

FIG. 3 shows the very simple circuit elements used to apply different possible potentials VS to the node B of the cells.

A first transistor T11 is made conductive by a reading mode control signal RD. It is then used to transmit the ground potential (VS=0) to the node B of all the cells together. A second transistor T12 is made conductive by an erasure mode control signal ER. It enables the transmission of a high potential of erasure VS=VER (for example 12 volts) to the node B of all the cells together. Finally, a third transistor T13 is made conductive by a programming control signal PR. It enables the transmission of an intermediate programming potential VS=VPR (5 to 7 volts) to the node B of all the cells together. This potential VPR is given by a supply circuit AL, for example from an external supply voltage Vpp of 12 volts.

For the programming, the programming data element D0, ND0 defines which one of the transistors, T5 or T6, of the cell CO will be made conductive, the other one then being off. The transistor that is made conductive grounds the drain of the corresponding floating-gate transistor. The corresponding floating-gate transistor is programmed by hot electrons while the source is at 5 to 7 volts and the gate is at a programming voltage of about 12 volts. The other floating-gate transistors is not programmed even though it receives the same gate and source voltages, because its drain remains at high impedance.

The reading and the erasure are done according to standard procedures. For the reading, the drains of the transistors T5 and T6 no longer receive the programming voltage VPRG and remain in a state of high impedance. The node B is grounded. For the erasure, the node B is at 12 volts and the gates of the floating-gate transistor are grounded.

Through the invention, it is possible to limit the structure to just one voltage pull-up circuit AL for all the cells instead of one pull-up circuit for each cell. Thus there is a saving of space in the integrated circuit.

The invention can be applied to memory cells different from those shown in FIG. 1. For example, the invention can be applied to a memory cell similar to FIG. 1, but wherein insulation transistors are interposed between the transistors T5 and T6 and the drains of TGF1 and TGF2, these insulation transistors, controlled by one and the same signal, enabling the selection of a single group of cells at a time and being off in reading mode to prevent the parasitic transmission of signals to the cell. Another type of cell to which the invention can be applied has an additional transistor controlled by the output OUT and interposed between the transistor T2 and the transistor T4 (to place the cell in a state of imbalance so that it has a well determined stable state even before programming). This second type of cell is described in U.S. patent application entitled Non-Volatile Programmable Bistable Multivibrator in Predefined Initial State For Memory Redundancy Circuit by Jean-Michel Mirabel, and French. patent application Ser. No. 94 01034 and 94 01036, each of which is incorporated herein by reference.

The structure of the memory cell is therefore not modified, but the programming command is different and the programming circuits are therefore modified accordingly, the modification includes in particular the elimination of the voltage pull-up circuits AL0 to ALn.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An electrically programmable non-volatile memory, comprising:

a bistable cell having two floating-gate transistors, each of the floating-gate transistors having a source, a drain, and a control gate; and means for applying, in a programming mode, a first fixed programming voltage to the source of each of the floating-gate transistors, a second fixed programming voltage to the control gate of each of the floating-gate transistors, and a zero voltage to the drain of one of the two floating-gate transistors and a high impedance to the drain of the other of the two floating-gate transistors depending on the state of programming desired for the cell, the zero voltage being the voltage applied to the sources of the floating-gate transistors in a reading mode.

2. The electrically programmable non-volatile memory according to claim 1, wherein each of the floating-gate transistors is a flash EPROM transistor that is programmable by hot electrons and erasable by the application of a sufficient field between its control gate and its source.

3. The electrically programmable non-volatile memory according to claim 1, wherein the bistable cell further includes first and second arms and a pair of first transistors, each of the first transistors having a gate, a source and a drain, each arm including one of the pair of first transistors coupled in series with one of the floating-gate transistors, the gate of the first transistor of the first arm being coupled to the drain of the first transistor of the second arm, and the gate of the first transistor of the second arm being coupled to the drain of the first transistor of the first arm to form a bistable multivibrator when the cell is programmed.

4. The electrically programmable non-volatile memory according to claim 1, in combination with a memory circuit to form a main memory, wherein the electrically programmable non-volatile memory includes a plurality of cells, each cell being coupled to an address line of the main memory so that the electrically programmable non-volatile memory implements a redundancy circuit for the non-volatile storage of addresses of defective elements of the memory circuit.

5. The electrically programmable non-volatile memory according to claim 2, wherein the bistable cell further includes first and second arms and a pair of first transistors, each of the first transistors having a gate, a source and a drain, each arm including one of the pair of first transistors coupled in series with one of the floating-gate transistors, the gate of the first transistor of the first arm being coupled to the drain of the first transistor of the second arm, and the gate of the first transistor of the second arm being coupled to the drain of the first transistor of the first arm to form a bistable multivibrator when the cell is programmed.

6. The electrically programmable non-volatile memory according to claim 2, in combination with a memory circuit to form a main memory, wherein the electrically programmable non-volatile memory includes a plurality of cells, each cell being coupled to an address line of the main memory so that the electrically programmable non-volatile memory implements a redundancy circuit for the non-volatile storage of addresses of defective elements of the memory circuit.

7. The electrically programmable non-volatile memory according to claim 3, in combination with a memory circuit to form a main memory, wherein the electrically programmable non-volatile memory includes a plurality of cells, each cell being coupled to an address line of the main memory so that the electrically programmable non-volatile memory implements a redundancy circuit for the non-volatile storage of addresses of defective elements of the memory circuit.

8. An electrically programmable non-volatile memory, comprising:

a plurality of bistable cells, each bistable cell including a first floating-gate transistor and a second floating-gate transistor, each floating-gate transistor having a source region, a drain region and a control gate, the source regions of the first and second floating-gate transistors of each bistable cell being connected together;

a first circuit that provides a first fixed programming voltage; and a second circuit, coupled to the first circuit and the plurality of bistable cells, that:

when the non-volatile memory is in a programming mode, applies the first fixed voltage to the source regions of the first and second floating-gate transistors of each bistable cell, a second fixed voltage to the control gates of the first and second floating-gate transistors of each bistable cell, and a zero voltage to the drain region of one of the first and second floating-gate transistors of each one of the bistable cells and a high impedance to the drain region of the other of the first and second floating-gate transistors depending on the state of programming desired for the one of the bistable cells, and when the non-volatile memory is in a reading mode, applies the zero voltage to the source regions of the first and second floating-gate transistors of each bistable cell.

9. The electrically programmable non-volatile memory according to claim 8, wherein each of the first and second floating-gate transistors is a flash EPROM transistor that is programmable by hot electrons and erasable by the application of a sufficient field between its control gate and its source region.

10. The electrically programmable non-volatile memory according to claim 8, wherein each bistable cell further includes:

a third transistor coupled in series with the first floating-gate transistor to form a first arm of the bistable cell and;

a fourth transistor coupled in series with the second floating-gate transistor to form a second arm of the bistable cell, each of the third and fourth transistors having a gate, a source and a drain, the gate of the third transistor being coupled to the drain of the fourth transistor and the gate of the fourth transistor being coupled to the drain of the third transistor to form a bistable multivibrator.

11. The electrically programmable non-volatile memory according to claim 8, in combination with a memory circuit to form a main memory, each bistable cell of the electrically programmable non-volatile memory being coupled to an address line of the main memory such that the electrically programmable non-volatile memory implements a redundancy circuit for the non-volatile storage of addresses of defective elements of the memory circuit.

12. The electrically programmable non-volatile memory according to claim 9, wherein each bistable cell further includes:

a third transistor coupled in series with the first floating-gate transistor to form a first arm of the bistable cell;

a fourth transistor coupled in series with the second floating-gate transistor to form a second arm of the bistable cell, each of the third and fourth transistors having a gate, a source and a drain, the gate of the third transistor being coupled to the drain of the fourth transistor and the gate of the fourth transistor being coupled to the drain of the third transistor to form a bistable multivibrator.

13. The electrically programmable non-volatile memory according to claim 9, in combination with a memory circuit to form a main memory, each bistable cell of the electrically programmable non-volatile memory being coupled to an address line of the main memory such that the electrically programmable non-volatile memory implements a redundancy circuit for the non-volatile storage of addresses of defective elements of the memory circuit.

14. The electrically programmable non-volatile memory according to claim 10, in combination with a memory circuit to form a main memory, each bistable cell of the electrically programmable non-volatile memory being coupled to an address line of the main memory such that the electrically programmable non-volatile memory implements a redundancy circuit for the non-volatile storage of addresses of defective elements of the memory circuit.

15. The electrically programmable non-volatile memory according to claim 8, wherein the first circuit is the only circuit that provides the first fixed programming voltage.

16. An electrically programmable non-volatile memory, comprising:

a first bistable cell including a first floating-gate transistor and a second floating-gate transistor, each of the first and second floating-gate transistors having a source region, a drain region and a control gate, the source regions of the first and second floating-gate transistors being connected together at a connection node; and a control circuit coupled to the first bistable cell, the control circuit being adapted to program the first bistable cell by applying a first voltage to the source regions of the first and second floating-gate transistors, a second voltage to the control gates of the first and second floating-gate transistors, a zero voltage to the drain region of one of the first and second floating-gate transistors and a high impedance to the drain region of the other of the first and second floating-gate transistors.

17. The electrically programmable non-volatile memory of claim 16, wherein the control circuit includes:

a voltage supply circuit, coupled to the connection node, that provides the first voltage to program the first and second floating-gate transistors.

18. The electrically programmable non-volatile memory of claim 17, wherein the voltage supply circuit includes:

a pull-up circuit having an output that provides the first voltage; and a switching circuit coupled to the output of the pull-up circuit and the connection node, the switching circuit having a control input that receives a programming signal to electrically connect the output of the pull-up circuit to the connection node in response to the programming signal.

19. The electrically programmable non-volatile memory of claim 18, wherein the voltage supply circuit further includes a first terminal that receives the second voltage, and a second terminal coupled to ground.

20. The electrically programmable non-volatile memory of claim 19, wherein the first voltage is within a range between approximately 5 and 7 volts; and wherein the second voltage is approximately 12 volts.

21. The electrically programmable non-volatile memory of claim 18, wherein the first bistable cell further includes:

a first switch having a first terminal coupled to the drain of the first floating-gate transistor, a second terminal, and a control input; and a second switch having a first terminal coupled to the drain of the second floating-gate transistor, a second terminal, and a control input, and wherein the control circuit further includes a programming switch having a first terminal coupled to each of the second terminals of the first and second switches, a second terminal coupled to ground, and a control input that receives the programming signal to electrically connect each of the drain regions of the first and second floating-gate transistors to ground in response thereto.

22. The electrically programmable non-volatile memory of claim 21, in combination with a memory circuit that includes an address line, and an inverter having an input coupled to the address line and an output, wherein the control input of the first switch of the first bistable cell is coupled to the address line, and wherein the control input of the second switch of the first bistable cell is coupled to the output of the inverter.

23. The electrically programmable non-volatile memory of claim 22, further comprising:

a second bistable cell including a third floating-gate transistor and a fourth floating-gate transistor, each of the third and fourth floating-gate transistors having a source region, a drain region and a control gate, the source regions of the third and fourth floating-gate transistors being connected together and being connected to the source regions of the first and second floating-gate transistors at the connection node, wherein the control circuit is further coupled to the second bistable cell, and wherein the control circuit is further adapted to simultaneously program the second bistable cell by applying the first voltage to the source regions of the third and fourth floating-gate transistors, the second voltage to the control gates of the third and fourth floating-gate transistors, the zero voltage to the drain region of one of the third and fourth floating-gate transistors and the high impedance to the drain region of the other of the third and fourth floating-gate transistors when the first bistable cell is programmed.

24. The electrically programmable non-volatile memory of claim 16, wherein the first bistable cell further includes:

a first switch having a first terminal coupled to the drain of the first floating-gate transistor, a second terminal, and a control input; and a second switch having a first terminal coupled to the drain of the second floating-gate transistor, a second terminal, and a control input, and wherein the control circuit includes a programming switch having a first terminal coupled to each of the second terminals of the first and second switches, a second terminal coupled to ground, and a control input that receives a programming signal to electrically connect each of the drain regions of the first and second floating-gate transistors to ground in response thereto.

25. The electrically programmable non-volatile memory of claim 24, in combination with a memory circuit that includes an address line, and an inverter having an input coupled to the address line and an output, wherein the control input of the first switch of the first bistable cell is coupled to the address line, and wherein the control input of the second switch of the first bistable cell is coupled to the output of the inverter.

26. The electrically programmable non-volatile memory of claim 25, further comprising:

a second bistable cell including a third floating-gate transistor and a fourth floating-gate transistor, each of the third and fourth floating-gate transistors having a source region, a drain region and a control gate, the source regions of the third and fourth floating-gate transistors being connected together and being connected to the source regions of the first and second floating-gate transistors at the connection node, wherein the control circuit is further coupled to the second bistable cell, and wherein the control circuit is further adapted to simultaneously program the second bistable cell by applying the first voltage to the source regions of the third and fourth floating-gate transistors, the second voltage to the control gates of the third and fourth floating-gate transistors, a zero voltage to the drain region of one of the third and fourth floating-gate transistors and a high impedance to the drain region of the other of the third and fourth floating-gate transistors when the first bistable cell is programmed.

27. The electrically programmable non-volatile memory of claim 16, in combination with a memory circuit that includes an address line, and an inverter having an input coupled to the address line and an output, wherein the control input of the first switch of the first bistable cell is coupled to the address line, and wherein the control input of the second switch of the first bistable cell is coupled to the output of the inverter.

28. The electrically programmable non-volatile memory of claim 27, further comprising:

a second bistable cell including a third floating-gate transistor and a fourth floating-gate transistor, each of the third and fourth floating-gate transistors having a source region, a drain region and a control gate, the source regions of the third and fourth floating-gate transistors being connected together and being connected to the source regions of the first and second floating-gate transistors at the connection node, wherein the control circuit is further coupled to the second bistable cell, and wherein the control circuit is further adapted to simultaneously program the second bistable cell by applying the first voltage to the source regions of the third and fourth floating-gate transistors, the second voltage to the control gates of the third and fourth floating-gate transistors, a zero voltage to the drain region of one of the third and fourth floating-gate transistors and a high impedance to the drain region of the other of the third and fourth floating-gate transistors when the first bistable cell is programmed.

29. The electrically programmable non-volatile memory of claim 16, further comprising:

a second bistable cell including a third floating-gate transistor and a fourth floating-gate transistor, each of the third and fourth floating-gate transistors having a source region, a drain region and a control gate, the source regions of the third and fourth floating-gate transistors being connected together and being connected to the source regions of the first and second floating-gate transistors at the connection node, wherein the control circuit is further coupled to the second bistable cell, and wherein the control circuit is further adapted to simultaneously program the second bistable cell by applying the first voltage to the source regions of the third and fourth floating-gate transistors, the second voltage to the control gates of the third and fourth floating-gate transistors, a zero voltage to the drain region of one of the third and fourth floating-gate transistors and a high impedance to the drain region of the other of the third and fourth floating-gate transistors when the first bistable cell is programmed.

30. An electrically programmable non-volatile memory, comprising:

a bistable cell including a first floating-gate transistor and a second floating-gate transistor, each of the first and second floating-gate transistors having a source region, a drain region and a control gate, the source regions of the first and second floating-gate transistors being connected together at a connection node; and programming means, coupled to the bistable cell, for programming the bistable cell by applying a first voltage to the source regions of the first and second floating-gate transistors, a second voltage to the control gates of the first and second floating-gate transistors, a zero voltage to the drain region of one of the first and second floating-gate transistors and a high impedance to the drain region of the other of the first and second floating-gate transistors.

\* \* \* \* \*